(12) United States Patent
Dunn et al.

(10) Patent No.: US 11,744,054 B2
(45) Date of Patent: Aug. 29, 2023

(54) FAN UNIT FOR PROVIDING IMPROVED AIRFLOW WITHIN DISPLAY ASSEMBLIES

(71) Applicant: Manufacturing Resources International, Inc., Alpharetta, GA (US)

(72) Inventors: William Dunn, Alpharetta, GA (US); Marcos Diaz, Alpharetta, GA (US); Mike Brown, Cumming, GA (US); Kevin O'Connor, Duluth, GA (US); Alex Moreau, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 4 days.

(21) Appl. No.: 17/409,360

(22) Filed: Aug. 23, 2021

(65) Prior Publication Data

US 2023/0059819 A1    Feb. 23, 2023

(51) Int. Cl.
*H05K 7/20* (2006.01)
*G02F 1/1333* (2006.01)

(52) U.S. Cl.
CPC ... *H05K 7/20972* (2013.01); *G02F 1/133385* (2013.01); *H05K 7/202* (2013.01)

(58) Field of Classification Search
None
See application file for complete search history.

(56) References Cited

U.S. PATENT DOCUMENTS

| | | |
|---|---|---|
| 4,093,355 A | 6/1978 | Kaplit et al. |
| 4,292,370 A | 9/1981 | Pekko |
| 4,593,978 A | 6/1986 | Mourey et al. |
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,029,982 A | 7/1991 | Nash |

(Continued)

FOREIGN PATENT DOCUMENTS

| | | |
|---|---|---|
| AU | 2011248190 B2 | 5/2011 |
| AU | 2014287438 B2 | 1/2018 |

(Continued)

OTHER PUBLICATIONS

Mentley, David E., State of Flat-Panel Display Technology and Future Trends, Proceedings of the IEEE, Apr. 2002, vol. 90, No. 4, pp. 453-459.

(Continued)

*Primary Examiner* — Richard H Kim
(74) *Attorney, Agent, or Firm* — Standley Law Group LLP; Jeffrey S. Standley; Adam J. Smith

(57) ABSTRACT

A fan unit for improved airflow within a display assembly is provided. Fans are provided at a housing which includes a rear wall defining a curved shape with peaks to accommodate one of the fans and a valley between adjacent ones of the fans. The fan units induce relatively laminar flow within certain portions of an airflow pathways extending with the display assembly and relatively turbulent flows in other portions of the display assembly when activated.

16 Claims, 10 Drawing Sheets

(56) References Cited

U.S. PATENT DOCUMENTS

| | | |
|---|---|---|
| 5,088,806 A | 2/1992 | McCartney et al. |
| 5,132,666 A | 7/1992 | Fahs |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,351,176 A | 9/1994 | Smith Stephen W. et al. |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,920,367 A | 7/1999 | Kajimoto et al. |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,359,390 B1 | 3/2002 | Nagai |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,437,673 B1 | 8/2002 | Nishida et al. |
| 6,473,150 B1 | 10/2002 | Takushima et al. |
| 6,476,883 B1 | 11/2002 | Salimes et al. |
| 6,493,440 B2 | 12/2002 | Gromatsky et al. |
| 6,504,713 B1 | 1/2003 | Pandolf et al. |
| 6,535,266 B1 | 3/2003 | Nemeth et al. |
| 6,628,355 B1 | 9/2003 | Takahara |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,416 B2 | 3/2007 | Paukshto et al. |
| 7,190,587 B2 | 3/2007 | Kim et al. |
| 7,209,349 B2 | 4/2007 | Chien et al. |
| 7,212,403 B2 | 5/2007 | Rockenfell |
| 7,259,964 B2 | 8/2007 | Yamamura et al. |
| 7,269,023 B2 | 9/2007 | Nagano |
| 7,284,874 B2 | 10/2007 | Jeong et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,518,864 B2 | 4/2009 | Kimura |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,800,706 B2 | 9/2010 | Kim et al. |
| 7,813,124 B2 | 10/2010 | Karppanen |
| 7,903,416 B2 | 3/2011 | Chou |
| 3,004,648 A1 | 8/2011 | Dunn |
| 7,995,342 B2 | 8/2011 | Nakamichi et al. |
| 8,035,968 B2 | 10/2011 | Kwon et al. |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |

(56) References Cited

U.S. PATENT DOCUMENTS

| | | |
|---|---|---|
| 9,119,330 B2 | 8/2015 | Hubbard et al. |
| 9,173,322 B2 | 10/2015 | Dunn |
| 9,173,325 B2 | 10/2015 | Dunn |
| 9,282,676 B1 | 3/2016 | Diaz |
| 9,285,108 B2 | 3/2016 | Dunn et al. |
| 9,313,917 B2 | 4/2016 | Dunn et al. |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,861,007 B2 | 1/2018 | Yoon et al. |
| 9,894,800 B2 | 2/2018 | Dunn |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Fun et al. |
| 10,383,238 B2 | 8/2019 | Fun et al. |
| 10,398,066 B2 | 8/2019 | Dunn et al. |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,656 B2 | 11/2020 | Hubbard |
| 10,827,657 B2 | 11/2020 | Lee |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Fhielemans et al. |
| 2004/0165139 A1 | 8/2004 | Anderson et al. |
| 2004/0223299 A1 | 11/2004 | Ghosh |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0081367 A1* | 4/2006 | Chiu .................... F04D 29/462 |
| | | 165/296 |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer et al. |
| 2006/0283579 A1 | 12/2006 | Ghosh et al. |

(56) References Cited

U.S. PATENT DOCUMENTS

| | | |
|---|---|---|
| 2007/0013647 A1 | 1/2007 | Lee et al. |
| 2007/0019419 A1 | 1/2007 | Hafuka et al. |
| 2007/0030879 A1 | 2/2007 | Hatta |
| 2007/0046874 A1 | 3/2007 | Machi et al. |
| 2007/0047239 A1 | 3/2007 | Kang et al. |
| 2007/0065091 A1 | 3/2007 | Hinata et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0267174 A1 | 11/2007 | Kim |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0148609 A1 | 6/2008 | Ogoreve |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0267790 A1 | 10/2008 | Gaudet et al. |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0310116 A1 | 12/2008 | O'Connor |
| 2008/0310158 A1 | 12/2008 | Harbers et al. |
| 2009/0009047 A1 | 1/2009 | Yanagawa et al. |
| 2009/0009729 A1 | 1/2009 | Sakai |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissier |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0258659 A1 | 10/2013 | Erion |
| 2013/0279154 A1* | 10/2013 | Dunn ................ H05K 7/20154 362/97.3 |
| 2013/0294039 A1 | 11/2013 | Chao |
| 2013/0344794 A1 | 12/2013 | Shaw et al. |
| 2014/0044147 A1 | 2/2014 | Wyatt et al. |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0268657 A1 | 9/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0192371 A1 | 7/2015 | Hancock |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |

(56) References Cited

U.S. PATENT DOCUMENTS

| | | |
|---|---|---|
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0116073 A1 | 4/2018 | Dunn |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0089176 A1 | 3/2019 | Dunn et al. |
| 2019/0133002 A1 | 5/2019 | Dunn et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2020/0154597 A1 | 5/2020 | Dunn et al. |
| 2020/0163235 A1 | 5/2020 | Dunn |
| 2020/0205303 A1 | 6/2020 | Dunn et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0387194 A1 | 12/2020 | Dunn |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0168949 A1 | 6/2021 | Dunn et al. |
| 2021/0243906 A1 | 8/2021 | Dunn |
| 2021/0243914 A1 | 8/2021 | Dunn |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| BR | PI0820231-1 | 2/2019 |
| CA | 2705814 C | 2/2018 |
| CA | 2947524 C | 4/2018 |
| CA | 2915261 C | 8/2018 |
| CA | 27982777 C | 6/2019 |
| CA | 2809019 C | 9/2019 |
| CA | 2888494 C | 9/2019 |
| CA | 2976116 C | 11/2020 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| GB | 2402205 A | 12/2004 |
| JP | 402062015 | 3/1990 |
| JP | 402307080 | 12/1990 |
| JP | 3153212 A | 7/1991 |
| JP | H06-2337 U | 1/1994 |
| JP | 6082745 A | 3/1994 |
| JP | H8-55567 A | 2/1996 |
| JP | 8115788 A | 5/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006-32890 A | 2/2006 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006-176112 A | 7/2006 |
| JP | 2007003638 A | 1/2007 |
| JP | 2007-293105 A | 11/2007 |
| JP | 09307257 A | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |

(56) References Cited

FOREIGN PATENT DOCUMENTS

| | | |
|---|---|---|
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 20000047899 A | 7/2000 |
| KR | 10-2067751 B1 | 1/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 100666961 B1 | 1/2007 |
| KR | 1020070070675 A | 4/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 1 0-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012021573 A2 | 2/2012 |
| WO | WO2012024426 A3 | 2/2012 |
| WO | 201 3/182733 A1 | 12/2013 |
| WO | WO2014062815 A1 | 4/2014 |
| WO | WO2014149773 A1 | 9/2014 |
| WO | WO2014150036 A1 | 9/2014 |
| WO | 201 5/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | 2018/200260 A1 | 11/2018 |
| WO | 2018/200905 A1 | 11/2018 |
| WO | WO2020/081687 A1 | 4/2020 |
| WO | WO2020/205305 A1 | 10/2020 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC. V Manufacturing Resources International, Inc.*, Defendant's Amended Answer and Counterclaims to Plaintiffs First Amended Complaint, Filed Apr. 24, 2018, 240 pages.
Itsenclosures, Product Catalog, 2009, 48 pages.
Itsenclosures, Standard Product Data Sheet, 2011, 18 pages.
SUNBRITETV, All Weather Outdoor LCD Television Model 4610HD, 2008, 1 page.
SUNBRITETV, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017,14 pages.
ADNATION,Turn Key Advertising Technology Solutions, May 23, 2017, 4 pages.
CIVIQ Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
CIVIQ, Invalidity Claim Charts, Appendix A-Appendix D, Jan. 24, 2018, 51 pages.
CIVIQ, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
CIVIQ, Invalidity Claim Chart, Appendix I, Mar. 22, 2018, 4 pages.
CIVIQ, Invalidity Claim Charts, Appendix F to H, Mar. 22, 2018, 18 pages.
Yung, Using Metal Core Printed Circuit Board as a Solution for Thermal Management article, 2007, 5 pages.
*CIVIQ Smartscapes, LLC V. Manufacturing Resources International, Inc.*, Memorandum Opinion re claim construction, Sep. 27, 2018, 16 pages.
*CIVIQ Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.

\* cited by examiner

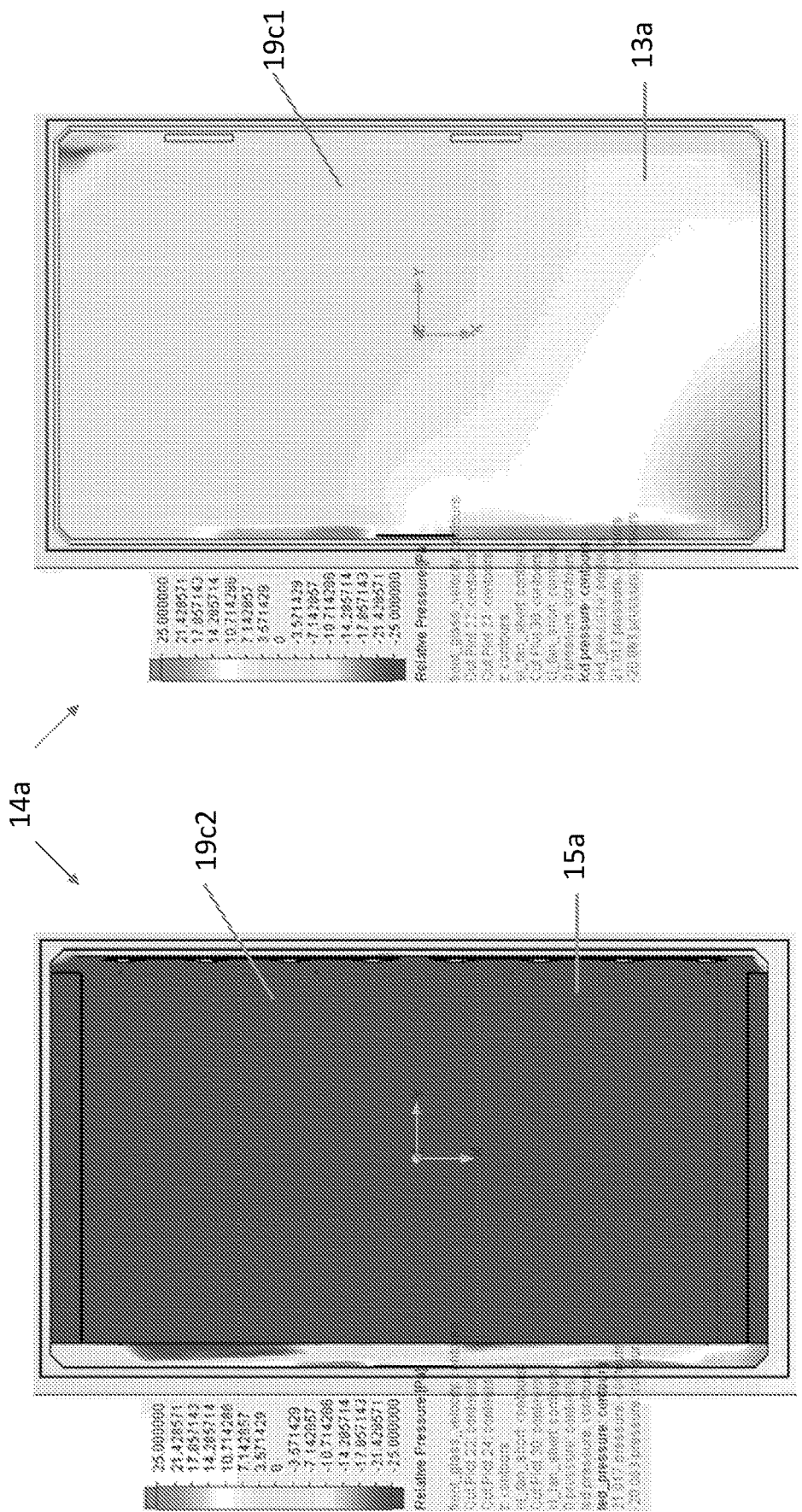

FAN UNIT FOR PROVIDING IMPROVED AIRFLOW WITHIN DISPLAY ASSEMBLIES

CROSS-REFERENCE TO RELATED APPLICATIONS

This application makes no priority claim.

TECHNICAL FIELD

Exemplary embodiments relate generally to fan units for providing improved airflow within display assemblies.

BACKGROUND AND SUMMARY OF THE INVENTION

Display assemblies often generate heat, such as from solar loading, ingestion of relatively warm ambient air, and/or powering of internal components such as a backlight. This results in a need to thermally manage such display assemblies, particularly when used in outdoor applications. It is known to provide back-to-back electronic displays with a common plenum, such as is provided in U.S. Pat. No. 8,373,841 issued Feb. 12, 2013, or a common heat exchanger, such as is provided in U.S. Pat. No. 8,351,014 issued Jan. 8, 2013. Fans are often used in such display assemblies to assist with such thermal management. As energy efficiency demands increase, what is needed are fan units which provide efficient airflow.

Fan units which provide efficient airflow are provided. The fan units may comprise a housing. Multiple fans may be provided within the housing. The fans may be centrifugal fans. The housing many comprise a rear wall having a generally curved shape. The rear wall may define a peak to accommodate each of the fans. The rear wall may define a valley between adjacent ones of the fans of a given unit. In this manner, the rear wall may define a generally double cosine shape. Alternatively, or additionally, the rear wall may define a generally wave or boomerang shape. The shape of the rear wall may be configured to direct air exhausted from the fans towards an exit opening.

The housing may comprise openings which accommodate intakes for each of the fans. The housing may comprise an exit opening. The exit opening may be defined, at least in part, by an angled leading edge. The exit opening may be fluidly adjacent to an entrance to a front passageway and/or an illumination device passageway of the display assembly. The front passageway may extend between a cover and an electronic display layer for a display subassembly mounted to a structural framework for the display assembly. The illumination device passageway may extend between the electronic display layer and an illumination device of the display subassembly. The angled leading edge may permit the fans to be positioned slightly back from the entrance to the front passageway and/or the illuminate device passageway, which may improve airflow.

The fan units may be configured to provide a relatively laminar flow through one or both of the front passageway and the illumination device passageway. A rear passageway may extend behind the illumination device and may be common to multiple ones of the display subassemblies mounted to the structural framework. In exemplary embodiment, each subassembly may comprise one or more closed loop fan units positioned adjacent to the entrance to said front passageway and/or said illumination device passageway for the respective subassembly. In exemplary embodiment, each of the closed loop fan units may comprise an exhaust fluidly adjacent to the entrance to one or both of said front passageway and an illumination device passageway and an intake fluidly adjacent to said rear passageway.

As each of the subassemblies may be completely or substantially identical, when positioned at opposing sides of the structural framework, the intake(s) for the closed loop fan unit(s) of a first one of the multiple subassemblies may be proximate to an exit of the front passageway and/or the illumination device passageway of a second one of the multiple subassemblies. Similarly, the intake(s) for the closed loop fan unit(s) of the second one of the multiple subassemblies may be proximate to the exit of the front passageway and/or the illumination device passageway of the first one of the multiple subassemblies. This may cause at least some of the air exiting the passageway and/or the illumination device passageway of a given one of the multiple subassemblies to be ingested by the closed loop fan unit of another of the multiple subassemblies. This may, alternatively or additionally, cause at least some of the air exiting the passageway and/or the illumination device passageway of a given one of the multiple subassemblies to travel through the rear passageway and be ingested by the closed loop fan unit of the given one of the multiple subassemblies. This arrangement may induce at least a partial cross-flow of circulating gas within the rear passageway and/or at least a partial counter flow of the circulating gas within the rear passageway when the closed loop fan unit(s) are activated, thereby resulting in relatively turbulent flow within the rear passageway, which may improve heat exchange efficiency. This may, alternatively, or additionally, permit relatively cool circulating gas exiting one of the subassemblies facing away from the sun to enter the front and/or illumination device passageways of an opposing one of the subassemblies facing the sun for added cooling.

The closed loop fan units may provide a relatively laminar flow through the front passageway and/or illumination device passageway, which may improve extraction of heat generated by solar loading and/or backlight use. Alternatively, or additionally, the laminar flow induced by the closed loop fan units may be configured to maintain a relatively flat electronic display layer for improved optics.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 7A is a front sectional view of exemplary fluid pressures for circulating gas within the illumination device passageway of the display assembly of FIG. 1;

FIG. 7B is a front sectional view of exemplary fluid pressures for circulating gas within the front passageway of the display assembly of FIG. 1.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
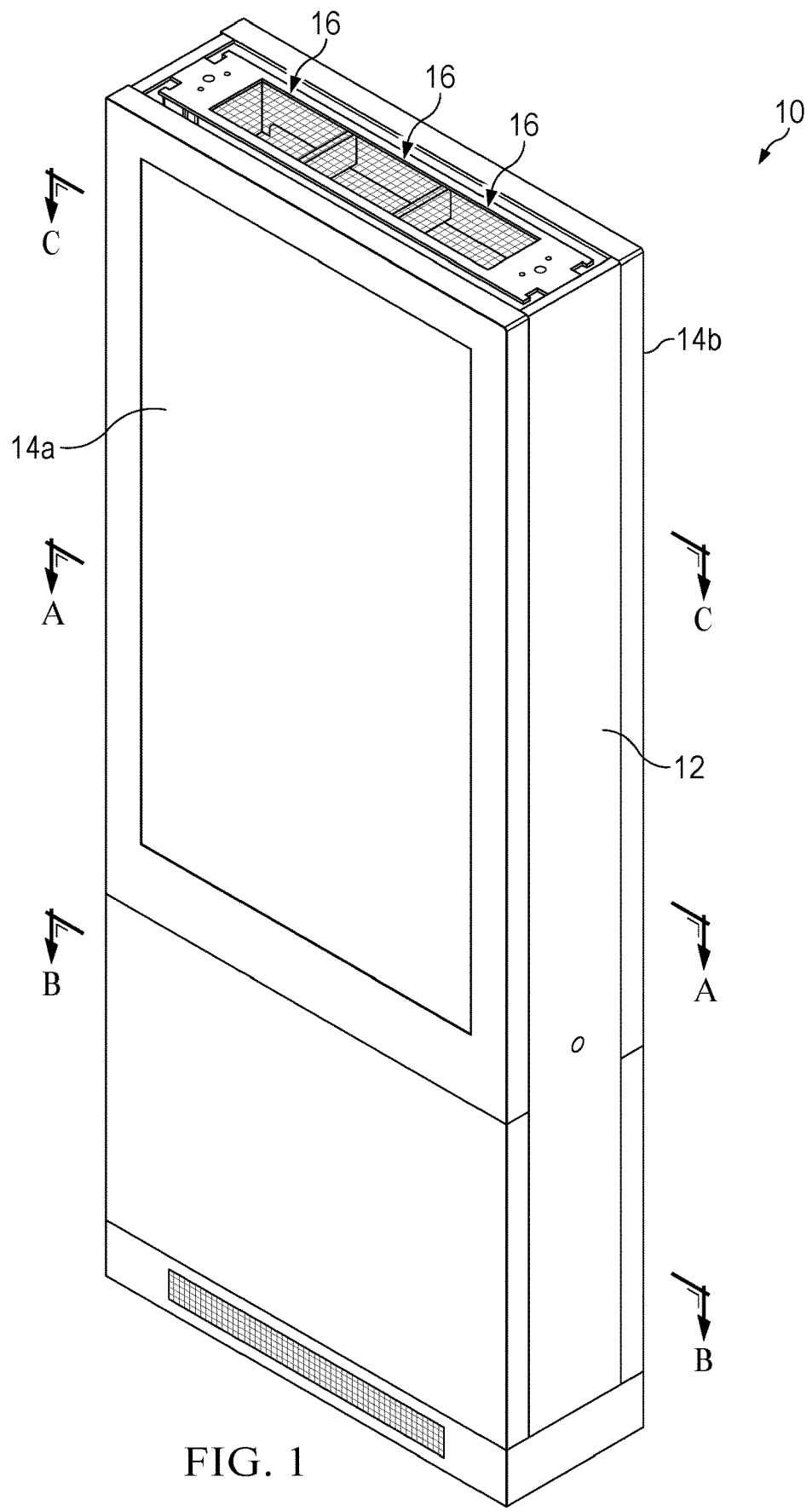
FIG. 1 is a front perspective view of an exemplary display assembly indicating section lines A-A, B-B, and C-C.

FIG. 1 is a perspective view of an exemplary electronic display assembly (hereinafter also a "unit") 10 in accordance with the present invention. The unit 10 may include a structural framework 12. The structural framework 12 may be configured for mounting to a ground surface, such as a sidewalk or street, mounting to a wall or other surface, incorporation into street furniture (e.g., phone booths, bus shelters, benches, railings, combinations thereof, or the like), combinations thereof, or the like. The structural framework 12 may comprise one or more members, panels, cladding, housings, combinations thereof, or the like.

The units 10 may comprise one or more electronic display subassemblies 14. Some or all of the electronic display subassemblies 14 may be attached to the structural framework 12 in a moveable manner, though such is not required. For example, the electronic display subassemblies 14 may be attached to the structural framework 12 in a hinged or otherwise moveable manner to permit selective movement between a closed position whereby certain parts of the units 10 are fully or partially sealed, and an open position whereby certain parts of the interior of the unit 10 are exposed for access. In exemplary embodiments, the units 10 may comprise a first and second electronic display subassemblies 14a, 14b placed on either side of the structural framework 12 such that the electronic display subassemblies 14a, 14b face in opposing directions.

One or more intakes/exhausts 16 may be provided at the units 10 for ingesting and/or exhausting ambient air.

Figure 2:
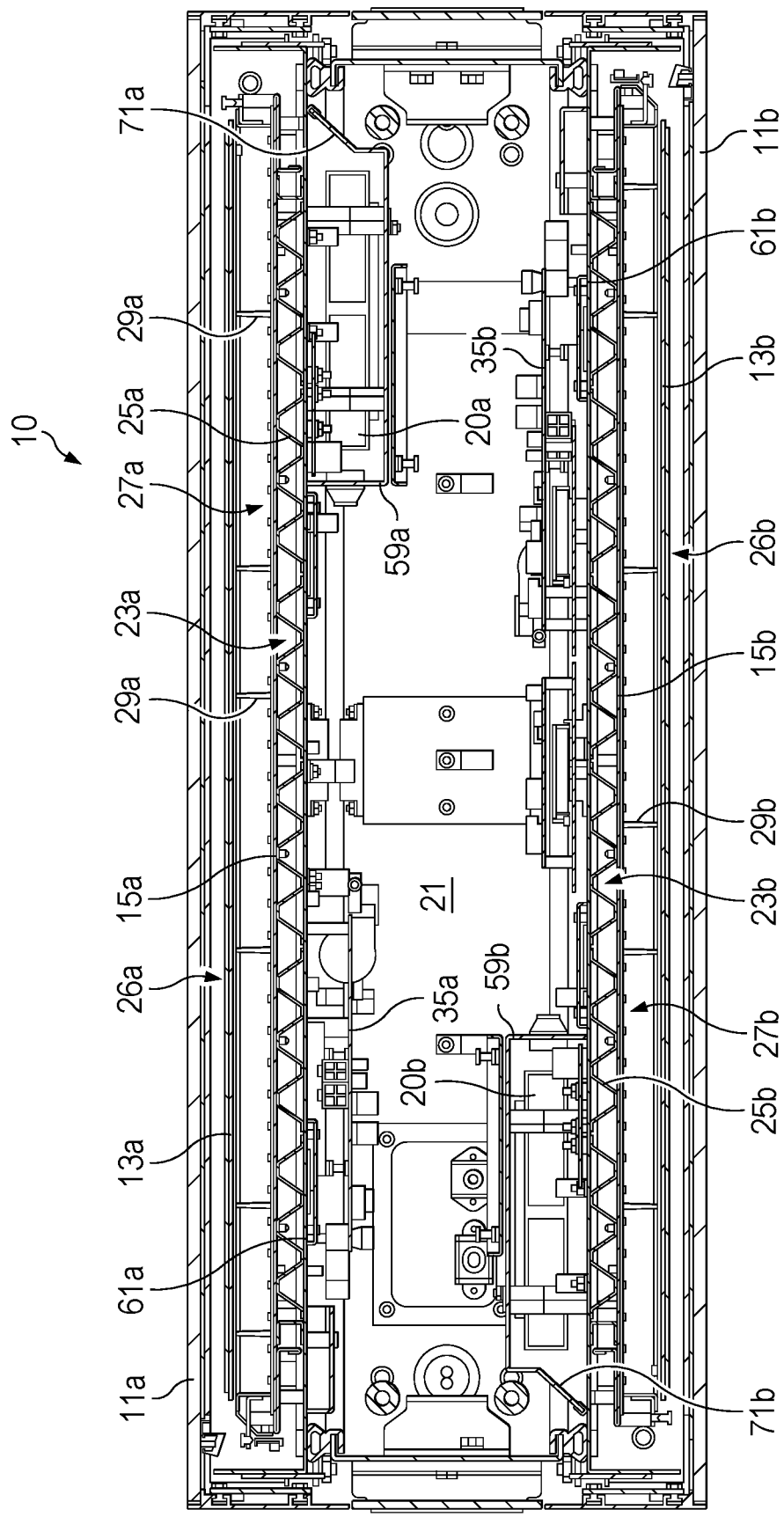
FIG. 2 is a top sectional view of an exemplary embodiment of the display assembly of FIG. 1 taken along section line A-A.
Figure 3:
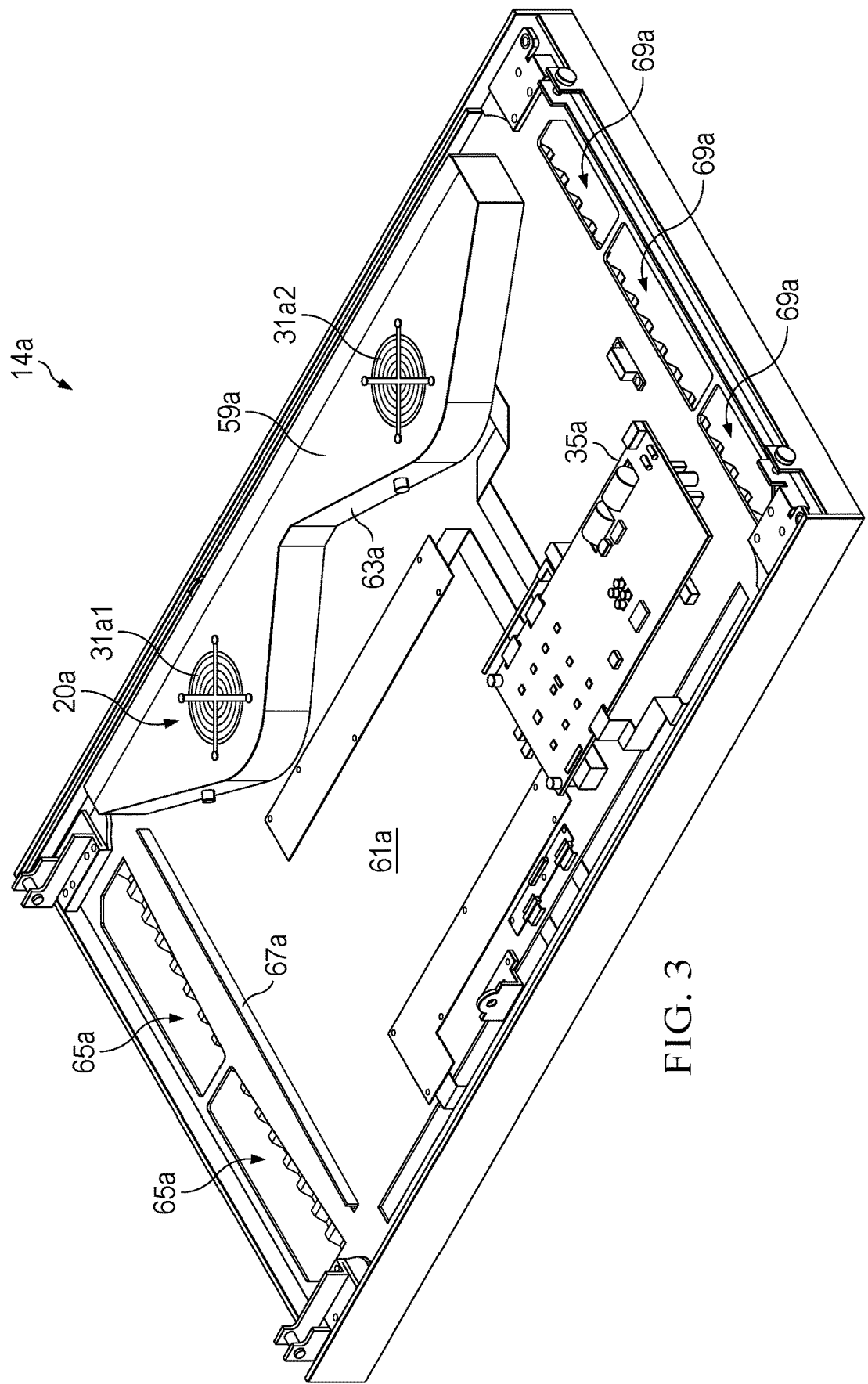
FIG. 3 is a rear perspective view of an exemplary first subassembly of the display assembly of FIG. 1 shown in isolation.
Figure 4:
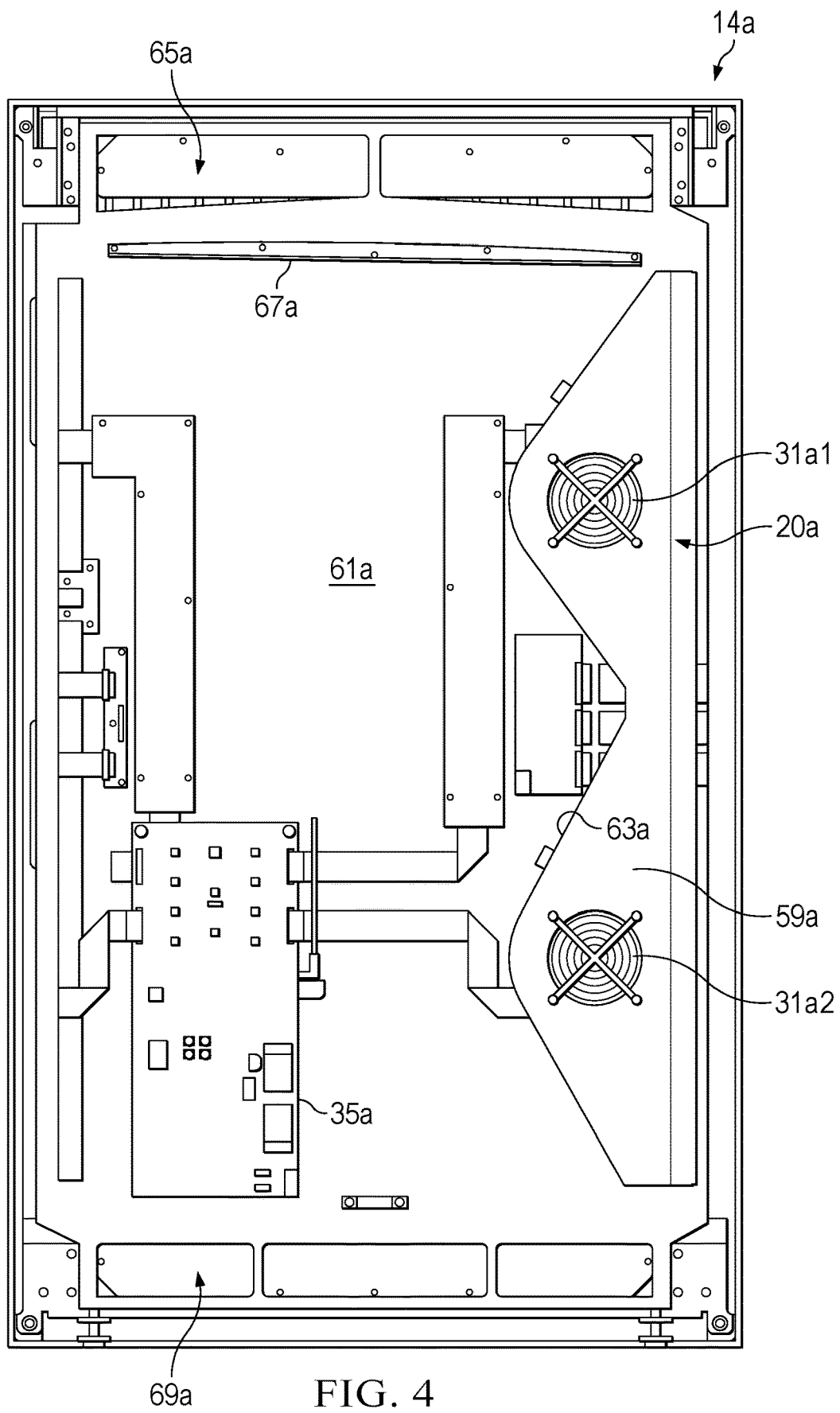
FIG. 4 is a rear view of the first subassembly of FIG. 3.

FIG. 2 through FIG. 4 illustrate exemplary internal structures of the units 10, and the various subassemblies 14. FIG. 5 through FIG. 8 illustrate exemplary airflows within the units 10, such as within the various subassemblies 14. While two electronic display subassemblies 14a, 14b placed in a back-to-back arrangement are shown, any number of electronic display subassemblies 14 may be utilized in any arrangement with the structural framework 12. Similar or the same components used in conjunction with units 10 having multiple electronic display subassemblies 14 may use the same numbering with the addition of an "a", "b" and/or "1", "2", etc. (e.g., 14 to 14a, 14b, 31a1 to 31a2). The use of a base number may refer to all such components (e.g., 14 to 14a, 14b).

Each electronic display subassembly 14 may comprise an illumination device 15. In exemplary embodiments, the illumination device 15 may comprise a number of lighting elements, such as LEDs, provided at a substrate, such as a printed circuit board. Each electronic display subassembly 14 may comprise an electronic display layer 13. The electronic display layer 13 may comprise a layer of liquid crystals, such as for a liquid crystal display, though any type or kind of electronic display may be utilized. In exemplary embodiments, the illumination device 15 may be provided rearward of the electronic display layer 13 to serve as a direct backlight. In other exemplary embodiments, the illumination device 15 may comprise one or more diffusive and/or transmissive layers and the substrate and/or lighting elements may be positioned about the edge of the electronic display layer 13 to provide edge lighting to the same. Alternatively, or additionally, one or more of the electronic display subassemblies 14 may comprise a cavity for a static poster instead of, or in addition to, the electronic display layer 13 and/or a blank panel.

The electronic display layer 13 and/or illumination device 15 of each subassembly 14 may be positioned rearward of a cover 11. The cover 11 may comprise one or more layers of a transparent or translucent material(s). In exemplary embodiments, each cover 11 may comprise two layers bonded with an optically clear adhesive, which may provide increased impact protection. One or more polarizers, anti-reflective materials, combinations thereof, or the like may be disposed on some or all of the cover 11 as a coating, film, layer, combinations thereof, or the like. The cover 11 may form part of the electronic display subassembly 14 or may be separate therefrom. The cover 11 and the structural framework 12 may together substantially enclose the units 10, such as with intakes/exhausts 16 exempted, when the subassemblies 14 are placed in a closed position. The cover 11 may be configured to move with the electronic display subassembly 14, may be configured for independent movement, and/or may be fixed to the structural framework 12. Each of the electronic display subassemblies 14 may be connected to the structural remark 12 in a hinged or otherwise movable manner, though such is not required.

Multiple such electronic display subassemblies 14 may be provided at a given structural framework 12 for a given unit 10. For example, without limitation, two such subassemblies 14 may be mountable to opposing sides of the structural framework 12 so that the electronic display layers 13 face in opposing directions, such as in a back-to-back arrangement. The electronic display subassemblies 14 may be of the same or different type and may comprise the same or different components. The electronic display subassemblies 14 and/or electronic display layers 13 may be provided in any arrangement such as portrait or landscape.

The intakes and/or exhausts 16 may be fluidly connected to one or more open loop airflow pathways 23 within the units 10. A respective one of the open loop airflow pathways 23a, 23b may extend through a respective one of the electronic display subassemblies 14a, 14b in exemplary embodiments such that an open loop airflow pathway is provided for each one of the electronic display subassemblies 14, which may be entirely separate, or partially separated from the other open loop airflow pathways, such as for a distance and rejoined. For example, without limitation, the open loop airflow pathways 23 may extend behind and along at least a portion of the illumination devices 15 for the electronic display layers 13 for accepting flows of ambient air. Each of the open loop airflow pathways 23 may comprise one or more corrugated layers 25 in exemplary embodiments. The corrugated layers 25 may improve heat transfer from the illumination device 15 to the ambient air by increasing available surface area.

One or more closed loop airflow pathways may be provided within the units 10. In exemplary embodiments, such closed loop airflow pathways may comprise at least a front passageway 26a, 26b of each of the subassemblies 14a, 14b, which may extend between the covers 11a, 11b and the electronic display layers 13a, 13b of the respective subassemblies 14a, 14b. Such closed loop airflow pathways may alternatively, or additionally, comprise at least an illumination device passageway 27a, 27b of each of the subassemblies 14a, 14b, which may extend between each of the electronic display layers 13a, 13b and the respective illumination devices 15a, 15b of the respective electronic display subassemblies 14a, 14b.

The closed loop airflow pathway may comprise a rear passageway 21, which may extend behind the electronic display subassemblies 14a, 14b, and/or the electronic display layers 13a, 13b. The rear passageway 21 may be common to at least two, or all of, the electronic display subassemblies 14 of a given unit 10. The rear passageway 21 may extend between each of the subassemblies 14. Such closed loop airflow pathways may extend entirely within the units 10, such as within outer boundaries of the structural framework 12 and/or the electronic display subassemblies 14. The rear passageway 21 may be defined, at least in part, by the structural framework 12 and/or the subassemblies 14.

Various electronic components 35a, 35b for operating the subassemblies 14a, 14b, respectively may be provided at rear panels 61a, 61b of the subassemblies 14a, 14b. The rear panels 61a, 61b may be provided rearward of the illumination devices 15a, 15b and spaced apart therefrom to at least partially define the open loop airflow pathways 23a, 23b and/or accommodate the corrugated layers 25a, 25b. In this manner, the electronic components 35a, 35b may be located within the rear passageway 21. The electronic components 35 may include, for example without limitation, video players, power supplies, processors, electronic storage devices, controllers, sensors, combinations thereof, or the like. Any number, type, and/or kind of electronic components 35 may be utilized. The electronic components 35 may be configured to control other components of the unit 10, such as, but not limited to, open loop fan units 18. Each of the open loop fan units 18 may comprise one or more fans 18a, 18b. The electronic components 35a, 35b of a respective one of the subassemblies 14a, 14b may be configured to control components of the respective one of the subassemblies 14a, 14b, though such is not necessarily required.

One or more open loop fan units 18 may be provided. Each of the subassemblies 14 may comprise open loop intakes 65 in fluid communication with the intakes/exhausts 16 for ingesting flows of ambient air 17a, 17b into the respective open loop airflow pathways 23a, 23b. Each of the subassemblies 14 may comprise an open loop exhaust 69 in fluid communication with the intakes/exhausts 16 for ingesting ambient air 17 into the respective open loop airflow pathways 23. The same of different open loop fan units 18 may be associated with each of the open loop airflow pathways 23. The open loop fan units 18 may be configured to ingest ambient air 17 into the units 10, exhaust ambient air 17 from the assembly 10, and/or move ingested ambient air 17 through the one or more open loop airflow pathways 23 when activated. Separate open loop fan units 18 may be used for each of the multiple electronic display subassemblies 14a, 14b or the open loop fan units 18 may be common to the various electronic display subassemblies 14 of such units 10.

Each of the electronic display subassemblies 14a, 14b may comprise a closed loop fan unit 20a, 20b. Each closed loop fan unit 20a, 20b may comprise one or more fans 31a1, 31a2, 31b1, 31b2 of a same or different type. The closed loop fan units 20 may be configured to move circulating gas through said one or more closed loop airflow pathways when activated. The closed and open loop fan units 20, 18 may comprise axial fans, centrifugal fans, combinations thereof, or the like. Any number or type of fan units 20, 18 may be used at any location in the units 10, and may be provided in banks or sets. Each of the fan units 20, 18 may be operated and/or controlled together or separately. The open loop airflow pathways may be partitioned and/or separated from the closed loop airflow pathways, though a complete (e.g., gas impermeable) separation or seal is not necessarily required. In exemplary embodiments, the separation may be sufficient to prevent solid and/or liquid particulate from passing therethrough and/or solid and/or liquid particulate above a given size from passing therethrough. For example, without limitation, such separation may be sufficient to meet certain ingress protection code (IPC) standards, such as but not limited to, IP65, IP67, or the like. Each of the electronic display subassemblies 14a, 14b may comprise one or more partitions 67a, 67b, gaskets, walls, panels, combinations thereof, or the like, which provide separation between the ambient air 17 in the open loop airflow pathways and the circulation gas 19 in the closed loop airflow pathway(s).

Each of the closed loop fan units 20a, 20b may comprise a respective housing 59a, 59b configured to wholly or partially surround each of the individual fans 31a1, 31a2, 31b1, 31b2 of the closed loop fan units 20a, 20b. The housings 59 may be configured to accommodate all of the closed loop fans 31 of a given fan unit 20. However, in other exemplary embodiments, each individual fans 31a1, 31a2, 31b1, 31b2 or groups of the individual fans 31a1, 31a2, 31b1, 31b2 may comprise separate housings 59. The housing 59 may be configured to permit ingestion of the circulating gas 19a/b in the rear passageway 21 and direct the ingested circulating gas 19 in an appropriate direction, such into the front passageway 26 and/or the illumination device passageway 27 of the electronic display subassembly 14. The housings 59 may be configured to provide a relatively laminar flow within the front passageway 26 and/or the illumination device passageway 27. The fans 31 may be positioned within the housings 59 to accomplish the same. For example, without limitation, an intake for the fans 31 may be fluidly adjacent to the rear passageway 21 and an exhaust for the fans 31 may be fluidly adjacent to the front passageway 26 and/or the illumination device passageway 27.

Each of the closed loop fan units 20a, 20b may be provided proximate to an entrance into one or both of the front passageway 26 and the illumination device passageway 27 for generating the flows 19c1, 19c2 through the front passageway 26 and the illumination device passageway 27, respectively, by pushing the circulating gas through the front passageway 26 and the illumination device passageway 27 when the fan(s) 31 are activated. An exhaust, relatively high-pressure side of the closed loop fan units 20 may be positioned fluidly adjacent to the front passageway 26 and/or the illumination device passageway 27, so that the pressure of the flows 19c1 and/or 19c2, particularly at the entrances to the front passageway 26 and the illumination device passageway 27, may be maintained at a relatively high level, such as greater than pressure of ambient air outside of the units 10, though such is not necessarily required. This may reduce or eliminate bowing of the electronic display layer 13 to improve optics. Alternatively, or additionally, this may reduce or eliminate tensile mechanical stresses on the electronic display layer 13 to reduce or eliminate cell breach.

The front passageway 26 and/or the rear passageway 27 may be configured to create and maintain a pressure differential between the flows 19c1 and 19c2 of the circulating gas 19 in the front passageway 26 and/or the rear passageway 27 sufficient to generate net forces at the electronic display layers 13 which reduces or eliminates bowing of the electronic display layers 13. In exemplary embodiments, the pressure of the flow 19c1 in the front passageway 26 may be maintained at a higher level than the flow 19c2 in the illumination device passageway 27, resulting in rearward forces against the electronic display layer 13 to reduce or eliminate outward bowing. Such pressure differentials may be generated using features including, but not limited to, those shown and/or described in U.S. Pat. No. 10,398,066 issued Aug. 27, 2019, the disclosures of which are hereby incorporated by reference as if fully restated herein.

In exemplary embodiments, positive pressure may be maintained in only the front passageway 26 and/or relatively high pressure may be maintained in the front passageway 26 (e.g., relative to pressure in the flow 19b in the illumination device passageway 27) such that the electronic display layer 13 is pushed towards the illumination device 15 when the closed loop fan unit 20 is operated. Optical spikes 29 or other support structures may be utilized within the illumination device passageway 27 to reduce or eliminate movement of the electronic display layer 13 towards the illumination device 15, such as past the optical spikes 29. The optical spikes 29 may comprise one or more optically transmissible materials. The optical spikes 29 may comprise rods, cones, or the like positioned within the illumination device cavity 27 and may be configured to limit or prevent rearward travel of the electronic display layer 13. The optical spikes 29 may exert normal, compressive forces on the electronic display layer 13, particularly in conjunction with the pressure of the flow 19a of the circulating gas within the front passageway 26. This may be particularly beneficial when unable to generate positive or sufficiently high pressure for the flow 19c2 of the circulating gas within the illumination device passageway 27. This may occur, for example, without limitation, due to variations in ambient air and/or circulating gas pressure. Circulating gas pressure, in particular, may vary due to temperature variations in the circulating gas (e.g., due to solar loading) and/or ambient temperatures, which may affect the unit's 10 ability to remove heat in air-to-air heat exchange.

Any number, type, kind, and/or arrangement of such optical spikes 29 may be utilized. In embodiments where more than one electronic display layer 13a, 13b is utilized, more than one set of optical spikes 29a, 29b for each respective one of the electronic display layers 13a, 13b of the same or different type may likewise be utilized, though such is not required. Such optical spikes 29 are not necessarily required, and may be omitted from view of certain embodiments provided herein to more clearly illustrate other components. However, such optical spikes 29 may be utilized in the same or similar arrangements in such embodiments, even if not expressly provided in the figures.

The housing 59 for the closed loop fan units 20 may comprise a generally curved shaped. A rear wall 63 of the housing 59 may define one or more peaks to accommodate respective ones of the fans 31 and a valley between adjacent ones of the fans 31. Each closed loop fan unit 20 may comprise any number of fans 31, and/or multiple closed loop fan units 20 and/or housings 59 may be used with each side assembly 14. Because the closed loop fans 31, particularly when provided as centrifugal fans, may be configured to exhaust fluid in a generally pinwheel pattern (e.g., outward from a center), the curved shape of the rear wall 63 may encourage relatively laminar flow into the front passageway 26 and/or illumination device passageway 27. The fans 31 may be spaced from the entrance to the front passageway 26 and/or illumination device passageway 27 and a leading edge 71a, 71b of the housings 59a, 59b may extend at an angle to encourage flow into the front passageway 26 and/or illumination device passageway 27. The rear wall 63 may define a generally sinusoidal shape curve by way of non-limiting example. Alternatively, or additionally, the rear wall 63 may define a generally wave or boomerang shape. The shape of the rear wall 63 need not be perfectly curved or smooth and may include one or more portions of which are planar.

Figure 5:
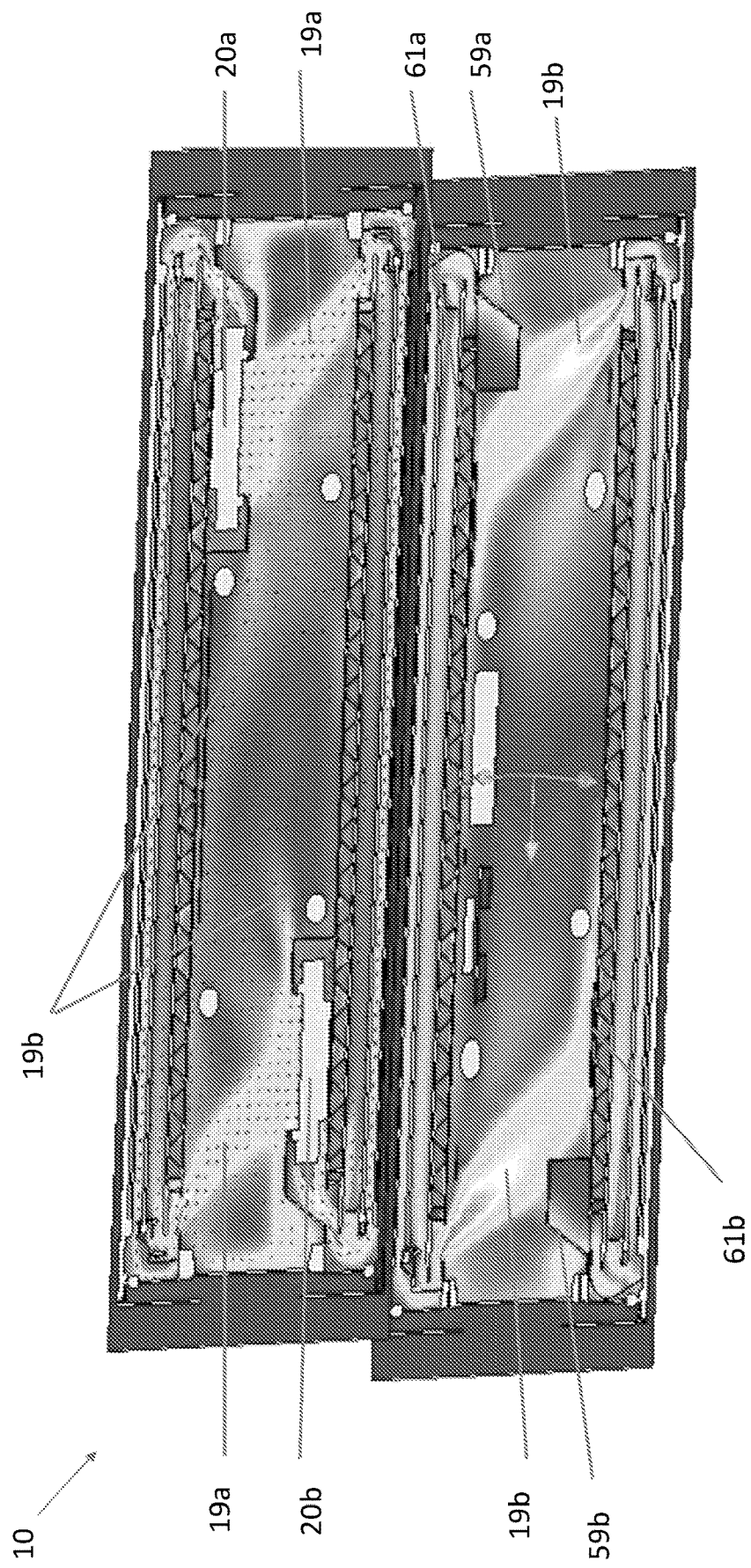
FIG. 5 is a top perspective sectional view of exemplary fluid velocities for the display assembly of FIG. 1 taken along section line C-C (upper layer) and section line B-B (lower layer) when operated under exemplary conditions.
Figure 5A:
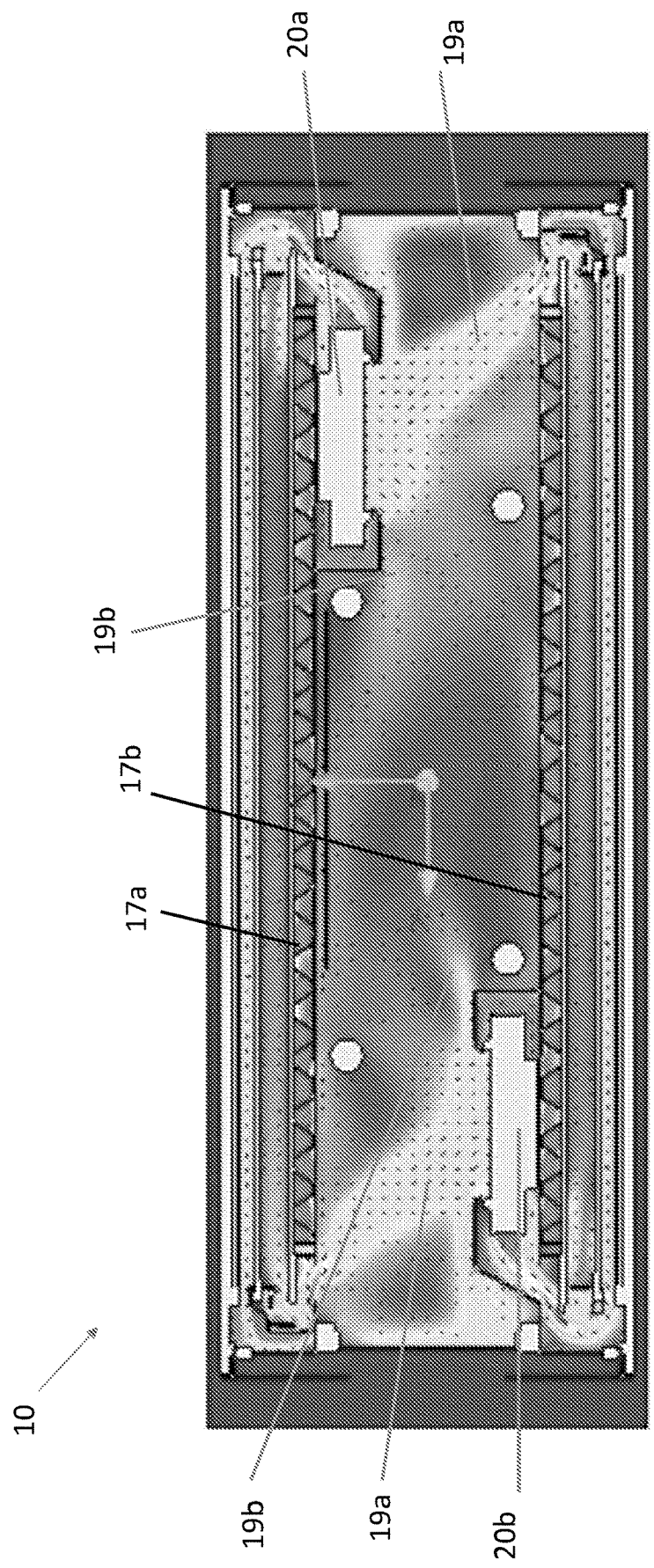
FIG. 5A is a top sectional view of the fluid velocities for the display assembly of FIG. 1 taken along section line C-C (upper layer) of FIG. 5.

When positioned on opposing sides of the structural framework 12, the closed loop fan units 20a, 20b may be located on opposing sides of the unit 10 from one another. This may be particularly true where the electronic display subassemblies 14a, 14b may be the same, or substantially the same. This arrangement may permit at least a first portion 19a of the circulating gas exiting the front passageways 26 and/or illumination device passageways 27 to cross over from one of the electronic display subassemblies 14a, 14b to the other. This may occur more often where the exiting portion 19a of the circulating gas generally aligns with an intake for the opposing closed loop fan unit 20, as shown, for example without limitation, in FIG. 5A. This may create a generally looping, continuous flow of the circulating gas 19 about both electronic display subassemblies 14. In such cases, at least a portion of the circulating gas 19 may traverse, rather than extend through, the rear passageway 21. This may be particularly helpful where one of the electronic display subassemblies 14a is not (or is less directly) exposed to the sun, thereby maintaining the circulating gas 19c1 in the front passageway 26a relatively cool, which may be immediately ingested to the front passageway 26b of the opposing one of the subassemblies 14b, which is (or is more directly) exposed to the sun, thereby removing heat generated by solar loading.

Some of the portion of the circulating gas 19 front passageways 26 and/or illumination device passageways 27 may not be ingested by the opposing closed loop fan unit 20 and may instead be reflected by various components, such as the rear panel 61, of the opposing subassembly 14 and cause generally chaotic or turbulent flow within the rear passageway 21.

A second portion 19b of the circulating gas exiting the front passageways 26a and/or illumination device passageways 27a may be attracted back to the closed loop fan 20a of the respective electronic display subassembly 14a from which it exited the exiting the front passageways 26a and/or illumination device passageways 27a such that the circulating gas forms a loop about one of the electronic display layers 13. This may be true of the other electronic display subassembly or subassemblies 14b of a given unit 10. This may create a generally counterflow within the rear passageway 21. In this manner, at least a portion of the circulating gas 19 may extend through the rear passageway. This may improve heat transfer.

The intersection of the second portions 19b of the circulating gas from the multiple subassemblies 14 may generate turbulent flow within the rear passageway 21. Furthermore, some of the second portion 19b may be reflected off the opposing electronic display subassembly 14, such as the housing 59 and/or rear panel 17, thereby increasing the turbulence. This may improve heat transfer by itself. It may also ensure adequate mixing between the first and second portions of the circulating gas 19a, 19b for relatively even thermal management.

Figure 5B:
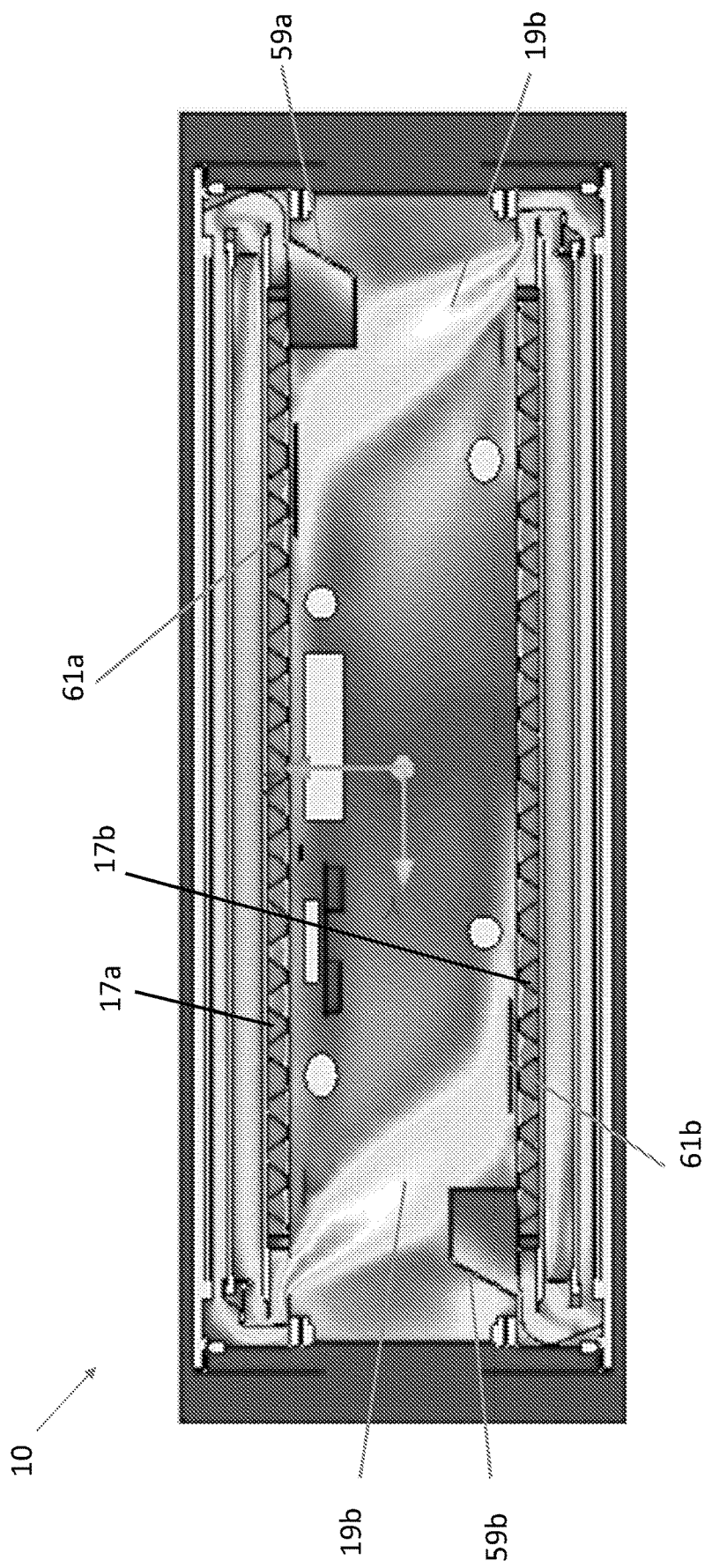
FIG. 5B is a top sectional view of the fluid velocities for the display assembly of FIG. 1 taken along section line B-B (lower layer) of FIG. 5.
Figure 6B:
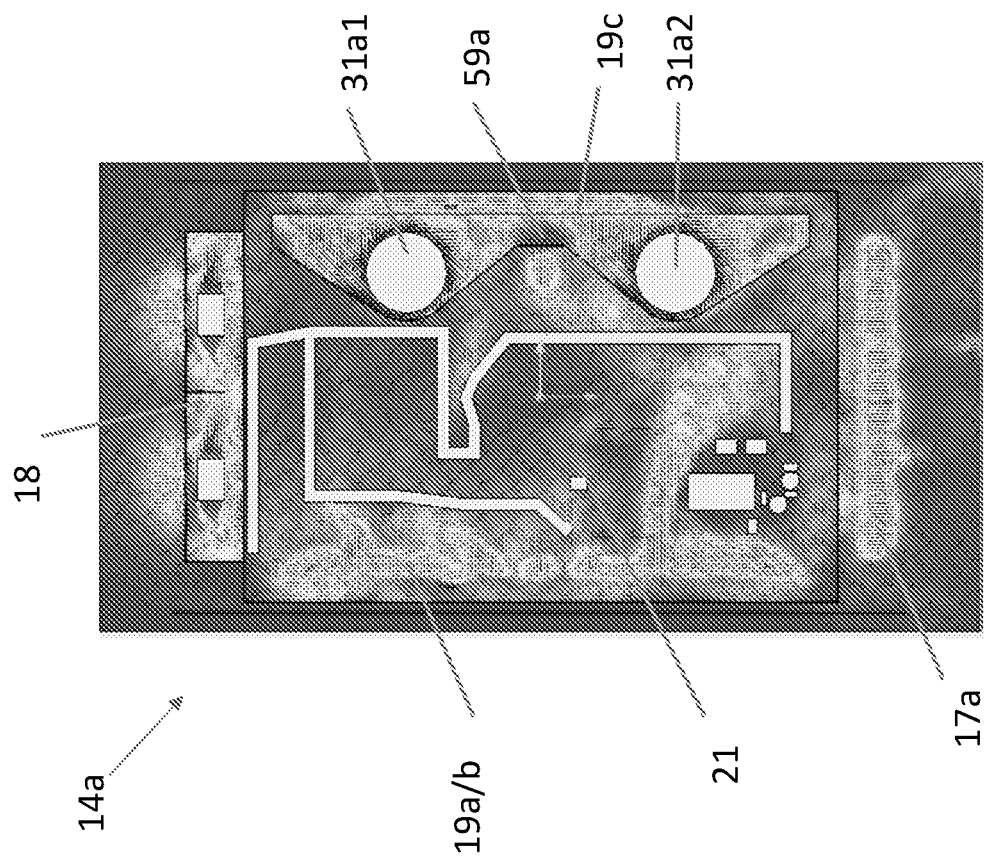
FIG. 6B is a front sectional view of exemplary fluid velocities for ambient air and circulating gas within another portion of the rear passageway of the display assembly of FIG. 1.
Figure 6A:
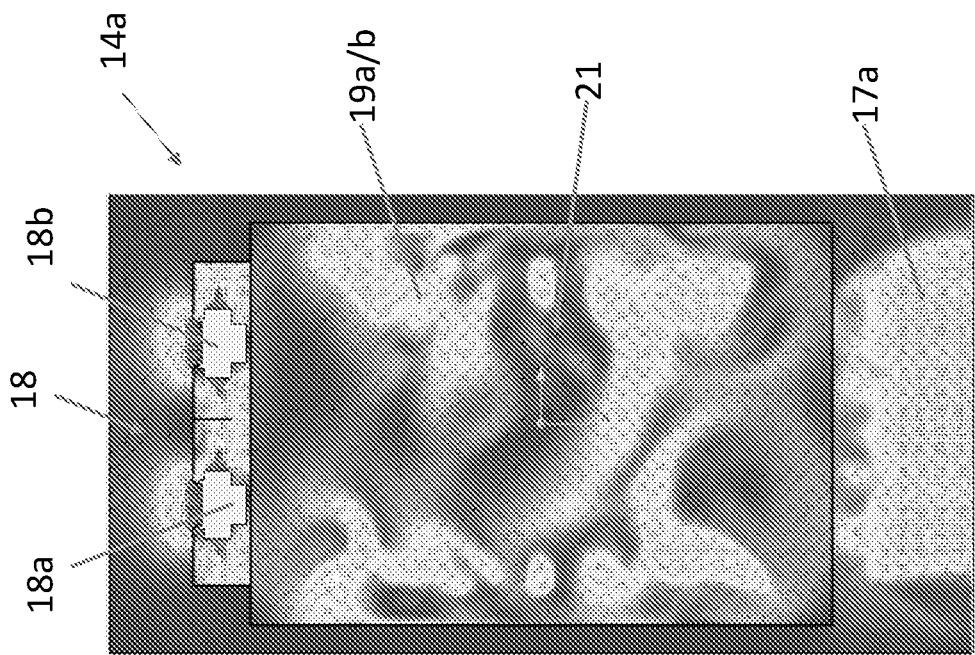
FIG. 6A is a front sectional view of exemplary fluid velocities for ambient air and circulating gas within a rear passageway of the display assembly of FIG. 1.
Figure 8:
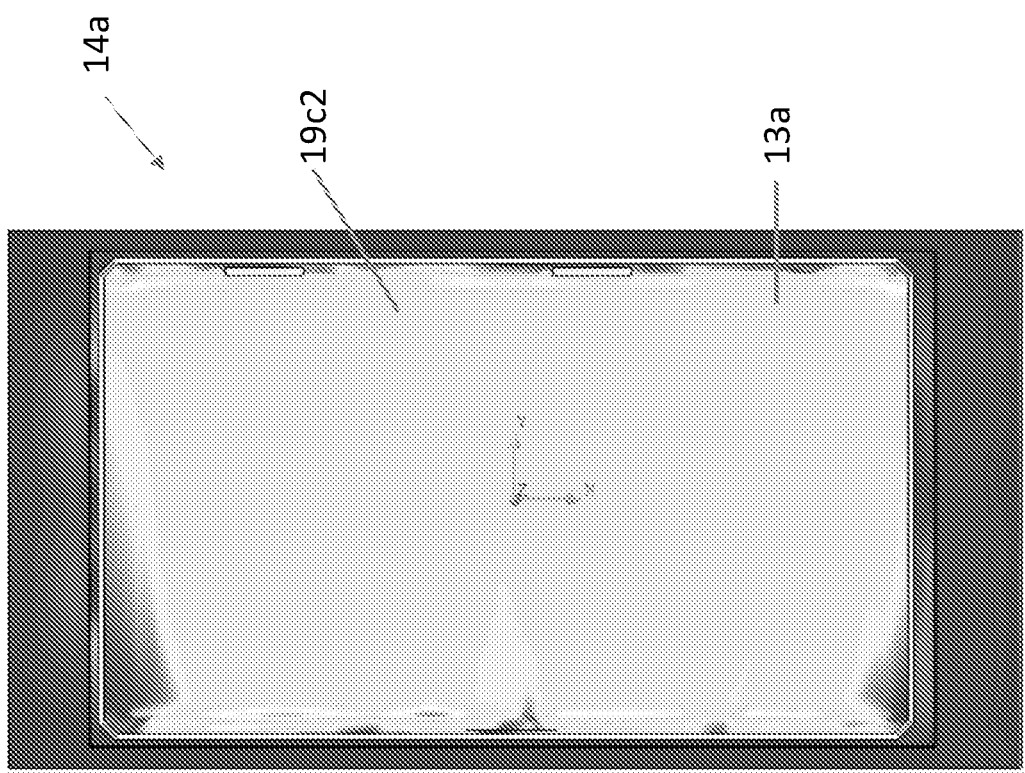
FIG. 8 is a front sectional view of exemplary fluid velocities for circulating gas within the front passageway of the display assembly of FIG. 1.

Portions of an exit from the front passageway 26 and/or illumination device passageway 27 may not generally align with intakes for fans 31 of opposing closed loop fan units 20, such as shown, for example, without limitation, in FIG. 5B. Instead, such portion of the exit from the front passageway 26 and/or illumination device passageway 27 may generally align with spaces between fans 31 of the opposing closed loop fan unit 20. This may result in a greater portion of the circulating gas 19c being directed through the rear passageway 21, rather than being ingested into the opposing one of the closed loop fan units 20, at least at these such locations, thereby increasing turbulence within the rear passageway 21. This may be facilitated, at least in part, by the spaced arrangement of the closed loop fans 31a1, 31a2, 31b1, 31b2 in a given closed loop fan unit 20a, 20b. The curved rear wall 63 of the housing 59 may facilitate this design by causing such existing circulating gas 19c to impact the rear panels 61 and be reflected or otherwise scattered therefrom.

As demonstrated by the various pressure and velocity plots of FIGS. 5-8, which are provided as non-limiting examples, this may induce relatively laminar flows within the front passageway 26 and/or illumination device passageway 27 and relatively turbulent flow within the rear passageway 21. The relatively laminar flows may provide consistent thermal management and improved optics while the relatively turbulent flows may improve heat transfer.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or specialized computing devices. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A fan unit for improved airflow within a display assembly, said fan unit comprising:
    a plurality of fans, each comprising a centrifugal fan; and
    a housing for said plurality of fans comprising an angled leading edge, a rear wall defining a plurality of peaks, each configured to accommodate one of said plurality of fans, a valley between adjacent ones of said plurality of fans, and a lower surface of said housing defined by a rear panel of an electronic display subassembly of said display assembly, wherein an intake for each of said plurality of fans is placed adjacent to an opening in an upper surface of said housing.

2. The fan unit of claim 1 wherein:
    said leading edge is configured to extend over an entrance to a front passageway and an illumination device passageway of said electronic display subassembly of said display assembly when said fan unit is installed at said electronic display subassembly.

3. A display assembly with improved airflow, said display assembly comprising:
    a structural framework;
    one or more electronic display subassemblies, each attached to said structural framework and comprising a fan unit;
    each of said fan units comprising:
        a plurality of fans; and
        a housing for said plurality of fans comprising a rear wall having a curved shape defining a plurality of peaks, each configured to accommodate one of said plurality of fans, a valley between adjacent ones of said plurality of fans, and a lower surface defined by a rear panel of the respective one of said one or more electronic display subassemblies.

4. The display assembly of claim 3 wherein:
    each of said fan units is positioned within a closed loop airflow pathway;
    said closed loop airflow pathway extends within said display assembly; and
    each of said fan units is configured to move circulating gas through said closed loop airflow pathway when activated.

5. The display assembly of claim 4 wherein:
    said closed loop airflow pathway comprises passageways extending through each of said one or more electronic display subassemblies.

6. The display assembly of claim 5 wherein:
an intake portion of each of said plurality of fans is fluidly adjacent to said rear passageway; and
an exhaust portion of each of said plurality of fans is fluidly adjacent to said passageways of said closed loop airflow pathway extending through each of said one or more electronic display subassemblies.

7. The display assembly of claim 6 wherein:
activation of said fan units of said one or more electronic display subassemblies is configured to generate a relatively turbulent flow of said circulating gas within said rear passageway and a relatively laminar flow of said circulating gas within said passageways of said closed loop airflow pathway extending through each of said one or more electronic display subassemblies.

8. The display assembly of claim 7 further comprising:
an open loop airflow pathway for ambient air.

9. The display assembly of claim 4 wherein:
each of said one or more electronic display subassemblies comprise:
    an electronic display layer;
    an illumination device for providing illumination to said electronic display layer when powered; and
    a cover positioned forward of said electronic display layer;
each of said fan units is located at a first side of a respective one of said electronic display subassemblies;
a rear passageway is provided rearward of each of said one or more electronic display subassemblies; and
said closed loop airflow pathway comprises portions of said first and second electronic display subassemblies and said rear passageway.

10. The display assembly of claim 9 wherein:
each of said plurality of fans comprises a centrifugal fan; and
an intake for each of said plurality of fans is placed adjacent to an opening in an upper surface of said housing.

11. The display assembly of claim 10 wherein:
said housing comprises an angled leading edge;
said leading edge is configured to extend over an entrance to a front passageway and an illumination device passageway of said respective one of said one or more electronic display subassemblies; and
said passageways comprise front passageways extending between said cover and said electronic display layer of said respective one of said one or more electronic display subassemblies and illumination device passageways extending between said electronic display layer and said illumination device of said respective one of said one or more electronic display subassemblies.

12. The display assembly of claim 11 wherein:
activation of said fan units of said one or more electronic display subassemblies is configured to generate a relatively turbulent flow of said circulating gas within said rear passageway and a relatively laminar flow of said circulating gas within said front passageways and said illumination device passageways of said one or more electronic display subassemblies.

13. The display assembly of claim 12 wherein:
said one or more electronic display subassemblies comprise at least a first and second electronic display subassembly mounted to opposing sides of said structural framework.

14. The display assembly of claim 13 wherein:
each of said one or more electronic display subassemblies is movably mounted to said structural framework.

15. A display assembly with improved airflow, said display assembly comprising:
a structural framework;
a plurality of electronic display subassemblies, each movably attached to a respective side of said structural framework and comprising:
    an electronic display layer;
    an illumination device;
    a rear panel; and
    a passageway;
    a fan unit mounted to said rear panel, wherein each of said fan units comprise:
        a plurality of fans; and
        a housing for said plurality of fans comprising:
            a rear wall having a curved shape defining:
                a plurality of peaks, each configured to accommodate one of said plurality of fans; and
                a valley between adjacent ones of said plurality of fans; and
            a lower surface defined by the rear panel;
a rear passageway located within said structural framework and between each of said plurality of electronic display subassemblies;
a closed loop airflow pathway for circulating gas comprising said rear passageway and said passageways of said plurality of electronic display subassemblies; and
an open loop airflow pathway for ambient air.

16. The display assembly of claim 15 wherein:
activation of said fan units is configured to induce a relatively laminar flow of said circulating gas within said passageways of said closed loop airflow pathway extending within each of said plurality of electronic display subassemblies and a relatively turbulent flow of said circulating gas within said rear passageway.

* * * * *

UNITED STATES PATENT AND TRADEMARK OFFICE
CERTIFICATE OF CORRECTION

PATENT NO. : 11,744,054 B2
APPLICATION NO. : 17/409360
DATED : August 29, 2023
INVENTOR(S) : William Dunn et al.

It is certified that error appears in the above-identified patent and that said Letters Patent is hereby corrected as shown below:

On the Title Page

On page 2, item [56] delete "3,004,648 A1 8/2011 Dunn" and insert -- 8,004,648 A1 8/2011 Dunn --.
On page 3, item [56] delete "10,359,817 B2 7/2019 Fun et al." and insert -- 10,359,817 B2 7/2019 Yun et al. --.
On page 3, item [56] delete "10,383,238 B2 8/2019 Fun et al." and insert -- 10,383,238 B2 8/2019 Yun et al. --.
On page 3, item [56] delete "2004/0135482 A1 7/2004 Fhielemans et al." and insert -- 2004/0135482 A1 7/2004 Thielemans et al. --.
On page 4, item [56] delete "2007/0046874 A1 3/2007 Machi et al." and insert -- 2007/0046874 A1 3/2007 Adachi et al. --.
On page 6, item [56] delete "KB 1 0-1885884 B1 7/2018" and insert -- KR 10-1885884 B1 7/2018 --.
On page 6, item [56] delete "WO 201 3/182733 A1 12/2013" and insert -- WO 2013/182733 A1 12/2013 --.
On page 6, item [56] delete "WO 201 5/138609 A2 9/2015" and insert -- WO 2015/138609 A2 9/2015 --.

Signed and Sealed this
Third Day of October, 2023

Katherine Kelly Vidal
*Director of the United States Patent and Trademark Office*